(12) United States Patent
Hino et al.

(10) Patent No.: US 8,720,965 B2
(45) Date of Patent: May 13, 2014

(54) ROBOT HAND AND ROBOT

(75) Inventors: Kazunori Hino, Fukuoka (JP); Ryuji Ando, Fukuoka (JP); Katsuhiko Shimada, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 0 days.

(21) Appl. No.: 13/414,720

(22) Filed: Mar. 8, 2012

(65) Prior Publication Data

US 2013/0076055 A1 Mar. 28, 2013

(30) Foreign Application Priority Data

Sep. 26, 2011 (JP) ................................. 2011-209881

(51) Int. Cl.
*B66F 19/00* (2006.01)

(52) U.S. Cl.
USPC ....... 294/213; 294/103.1; 901/36; 414/744.5; 414/744.8; 414/941

(58) Field of Classification Search
USPC ......... 294/213, 103.1, 902, 119.1; 414/744.5, 414/744.6, 935, 941, 937, 744.8; 74/490.03, 490.04; 901/8, 15, 28, 30, 901/47, 31, 36, 38
See application file for complete search history.

(56) References Cited

U.S. PATENT DOCUMENTS

| | | | | |
|---|---|---|---|---|
| 5,810,935 A | * | 9/1998 | Lee et al. | 118/728 |
| 6,167,893 B1 | * | 1/2001 | Taatjes et al. | 134/147 |
| 6,685,422 B2 | * | 2/2004 | Sundar et al. | 414/744.5 |
| 6,752,442 B2 | * | 6/2004 | McNurlin et al. | 294/106 |
| 7,286,890 B2 | * | 10/2007 | Machiyama et al. | 700/114 |
| 7,661,921 B2 | * | 2/2010 | Kim et al. | 414/744.5 |
| 2002/0071756 A1 | * | 6/2002 | Gonzalez | 414/941 |
| 2005/0026324 A1 | | 2/2005 | Hofer et al. | |

FOREIGN PATENT DOCUMENTS

| | | |
|---|---|---|
| JP | 62-47542 | 3/1987 |
| JP | 62-88583 | 6/1987 |
| JP | 10-279068 | 10/1998 |
| JP | 2003-077980 | 3/2003 |
| JP | 2003-142554 | 5/2003 |
| JP | 2004-063668 | 2/2004 |
| JP | 2009-026859 | 2/2009 |

OTHER PUBLICATIONS

Japanese Office Action for corresponding JP Application No. 2011-209881, Sep. 03, 2013.
Japanese Office Action for corresponding JP Application No. 2011-209881, Dec. 24, 2013.

* cited by examiner

*Primary Examiner* — Stephen Vu
(74) *Attorney, Agent, or Firm* — Ditthavong Mori & Steiner, P.C.

(57) ABSTRACT

A robot hand and a robot according to an embodiment include supporting units. The supporting units are arranged on a base and contact the peripheral border of a board to grip the board. At least one of the supporting units rotates while abutting on the peripheral border of the board.

19 Claims, 7 Drawing Sheets

FIG.7
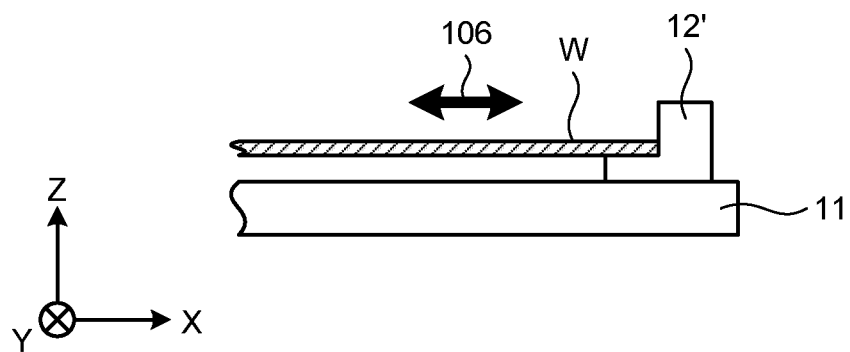
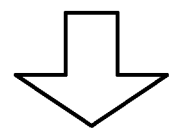
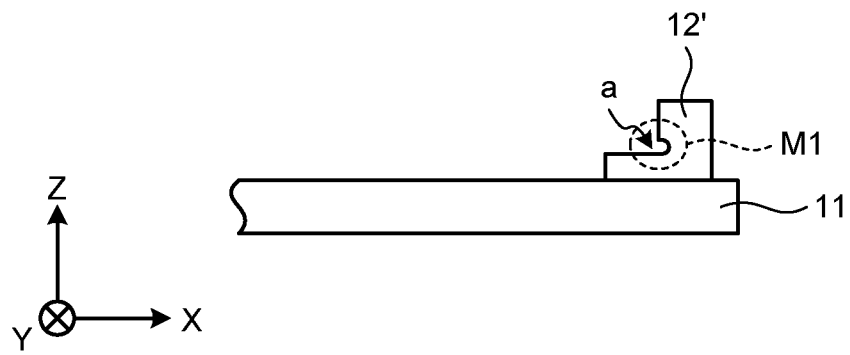

ROBOT HAND AND ROBOT

CROSS-REFERENCE TO RELATED APPLICATION

This application is based upon and claims the benefit of priority of the prior Japanese Patent Application No. 2011-209881, filed on Sep. 26, 2011, the entire contents of which are incorporated herein by reference.

FIELD

The embodiment discussed herein is directed to a robot hand and a robot.

BACKGROUND

A conventional robot for board conveyance that conveys a discoid board such as a semiconductor wafer has been known. The robot has a robot hand that includes a plurality of gripping members such as gripping claws and sandwiches the peripheral border of a board placed on the robot hand between the gripping members to grip the board at a predetermined position.

For example, Japanese Laid-open Patent Publication No. H10-279068 discloses a board conveying apparatus that includes a robot hand that has a moving guide that is a movable gripping member and a fixed guide that is a fixed gripping member and that presses a board to the wall surface of the fixed guide by using the moving guide to perform a gripping operation.

However, the conventional robot hand has a problem in that the gripping member is easy to be worn away by repeating the pressing. For this reason, the gripping member is highly frequently exchanged and thus it takes a lot of trouble over maintenance.

SUMMARY

A robot hand and a robot according to an aspect of an embodiment include supporting units. The supporting units are arranged on a base and contact the peripheral border of a board to grip the board. At least one of the supporting units rotates while abutting on the peripheral border of the board.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 7 is a diagram illustrating a configuration example of a conventional fixed claw.

DESCRIPTION OF EMBODIMENT

Hereinafter, a robot hand and a robot according to an embodiment of the present disclosure will be explained in detail with reference to the accompanying drawings.

Hereinafter, it is mainly explained that a board is a semiconductor wafer.

It is assumed that a gripping member that sandwiches and grips the peripheral border of the board is mainly described as a "gripping claw". Moreover, it is assumed that "gripping" of "gripping claw" includes supporting the board at a predetermined position in addition to the sandwiching of the peripheral border of the board. In other words, the "gripping claw" may be referred to as a "supporting unit".

Figure 1:
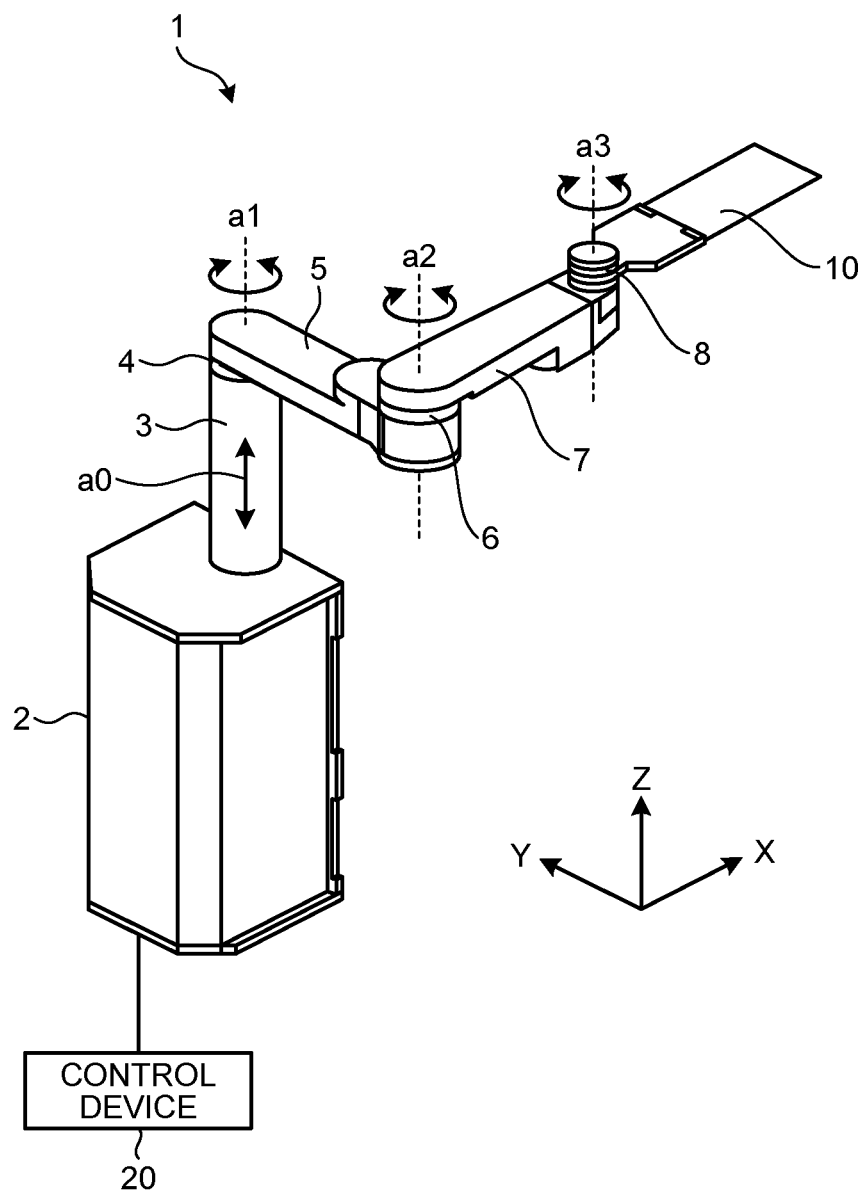
FIG. 1 is a diagram illustrating a configuration example of a robot according to an embodiment.

FIG. 1 is a diagram illustrating a configuration example of a robot 1 according to the embodiment. In order to make an explanation understandable, a three-dimensional rectangular coordinate system that includes Z-axis of which the positive direction is a vertically upward direction is illustrated in FIG. 1. The rectangular coordinate system may be employed by other drawings that are used for the following explanations.

As illustrated in FIG. 1, the robot 1 is an articulated robot and includes a base 2, arms 3, 5, and 7, joints 4, 6, and 8, and a robot hand 10.

A control device 20 is connected to the robot 1. The gripping operation and conveying operation of a board performed by the robot 1 is controlled by the control device 20. Moreover, the control is performed on the basis of teaching data that is previously stored in the control device 20.

The arm 3 is slidably provided in a vertical direction (Z-axis direction) from the base 2 (see a double-headed arrow a0 in the diagram). As a result, the robot hand 10 can rise and fall in a vertical direction.

The arm 5 is connected to the arm 3 via the joint 4. At this time, the arm 5 is rotatably supported around a rotation axis a1 of the joint 4 (see a double-headed arrow around the rotation axis a1). Similarly, the arm 7 is connected to the arm 5 via the joint 6. At this time, the arm 7 is rotatably supported around a rotation axis a2 of the joint 6 (see a double-headed arrow around the rotation axis a2).

The robot hand 10 is an end effector that grips a board such as a semiconductor wafer placed thereon. The robot hand 10 is connected to the termination end of the arm 7 via the joint 8. At this time, the robot hand 10 is rotatably supported around a rotation axis a3 of the joint (see a double-headed arrow around the rotation axis a3).

Herein, each of the joint 4, the joint 6, and the joint 8 includes therein a drive mechanism (not illustrated) such as for example an actuator and a motor. The arm 5, the arm 7, and the robot hand 10 perform turning operations along a XY plane in the diagram in accordance with the drive of the drive mechanism.

It has been illustrated in FIG. 1 that the robot 1 includes the one robot hand 10. However, the number of the robot hands is not limited to one. For example, a plurality of robot hands may be provided around the rotation axis a3 in an overlapping manner like a minute hand and an hour hand of an analog clock.

Figure 2:
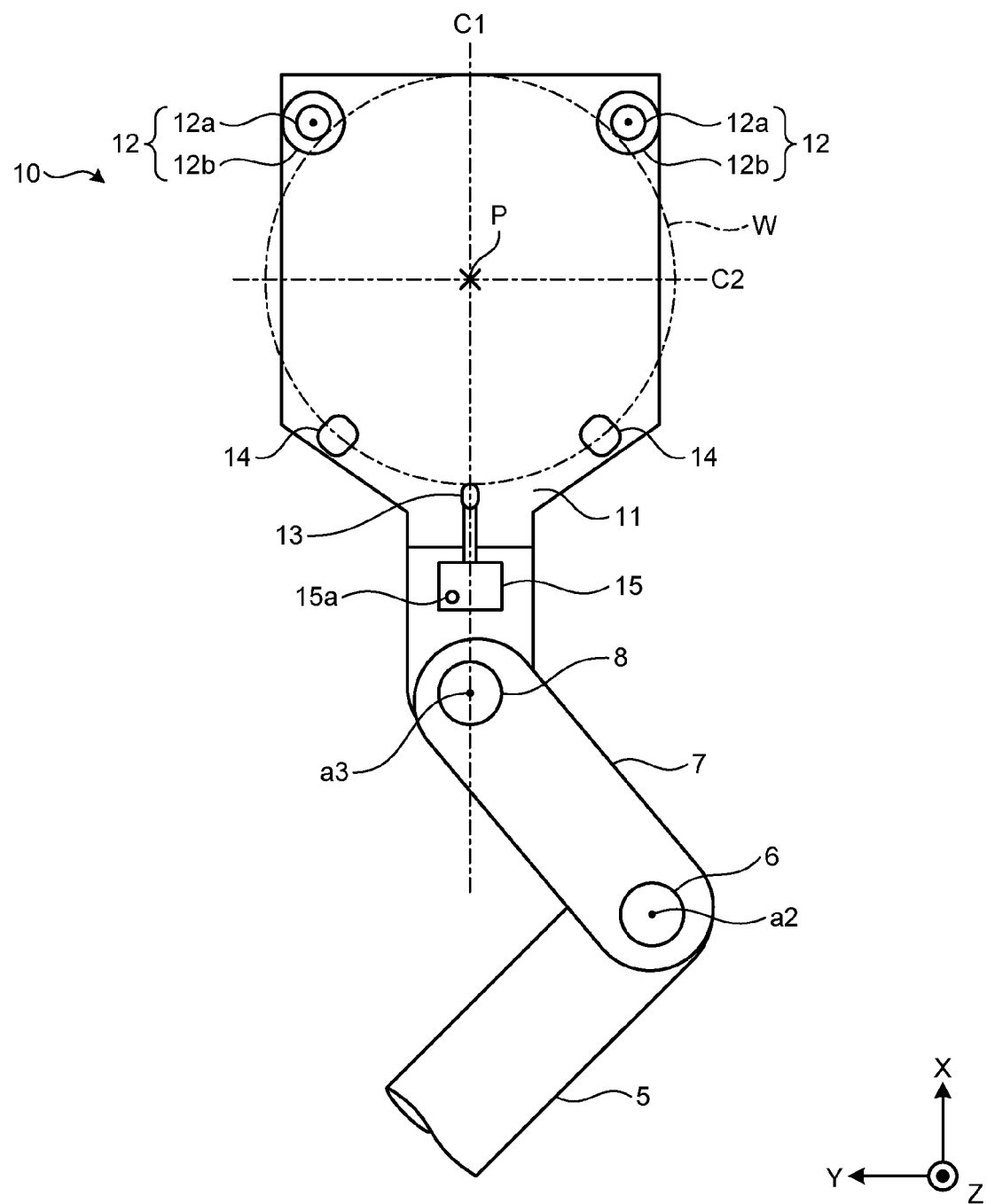
FIG. 2 is a diagram illustrating a configuration example of a robot hand according to the embodiment.

Next, a configuration example of the robot hand 10 according to the embodiment is explained with reference to FIG. 2. FIG. 2 is a diagram illustrating a configuration example of the robot hand 10 according to the embodiment. The diagram illustrated in FIG. 2 is a plan view of the robot hand 10 when being viewed from the positive direction of Z-axis. Herein, explanations on the arm 5, the joint 6, the arm 7, the joint 8, the rotation axis a2, and the rotation axis a3 that are already illustrated in FIG. 1 are omitted.

As illustrated in FIG. 2, the robot hand 10 includes a plate 11, fixed claws 12, a movable claw 13, receiving seats 14, and a driving unit 15. The fixed claw 12 includes a roller 12a that can rotate along the peripheral border of a board W and a receiving seat 12b. Moreover, the roller 12a and the receiving seat 12b are integrally concatenated, and the receiving seat 12b rotates along with the roller 12a.

The plate 11 is a member that is also referred to as a basement or a base on which the board W is placed. Here, it has been illustrated in FIG. 2 that the plate 11 is shaped like a shovel. However, the shape of the plate 11 is not limited to a shovel. Moreover, the plate 11 may be functionally referred to as a "placing unit".

The fixed claw 12 is a fixed gripping claw that is provided in the plate 11 and is not displaced from a given position. For example, the fixed claw 12 is placed near the leading end of the plate 11. Moreover, it is illustrated in FIG. 2 that a pair of the fixed claws 12 is placed at both ends of the leading end of the plate 11.

In the case of the fixed claw 12, the roller 12a comes into contact with the peripheral border of the board W and the receiving seat 12b supports the board W from the lower side (in other words, in the positive direction of Z-axis). Moreover, the details of the fixed claw 12 are explained below with reference to FIGS. 4A and 4B.

The movable claw 13 is a movable gripping claw. For example, the movable claw 13 is provided near the tail end of the plate 11 to be slidable along X-axis in the diagram. The details of operations of the movable claw 13 are explained below with reference to FIG. 3.

Similarly to the receiving seat 12b, the receiving seat 14 is a member that supports the board W from the lower side. Moreover, it is illustrated in FIG. 2 that a pair of the receiving seats 14 is placed at both ends of the tail end of the plate 11.

The driving unit 15 is a drive mechanism that slide the movable claw 13. For example, the driving unit 15 is constituted by an air cylinder or the like.

Figure 3:
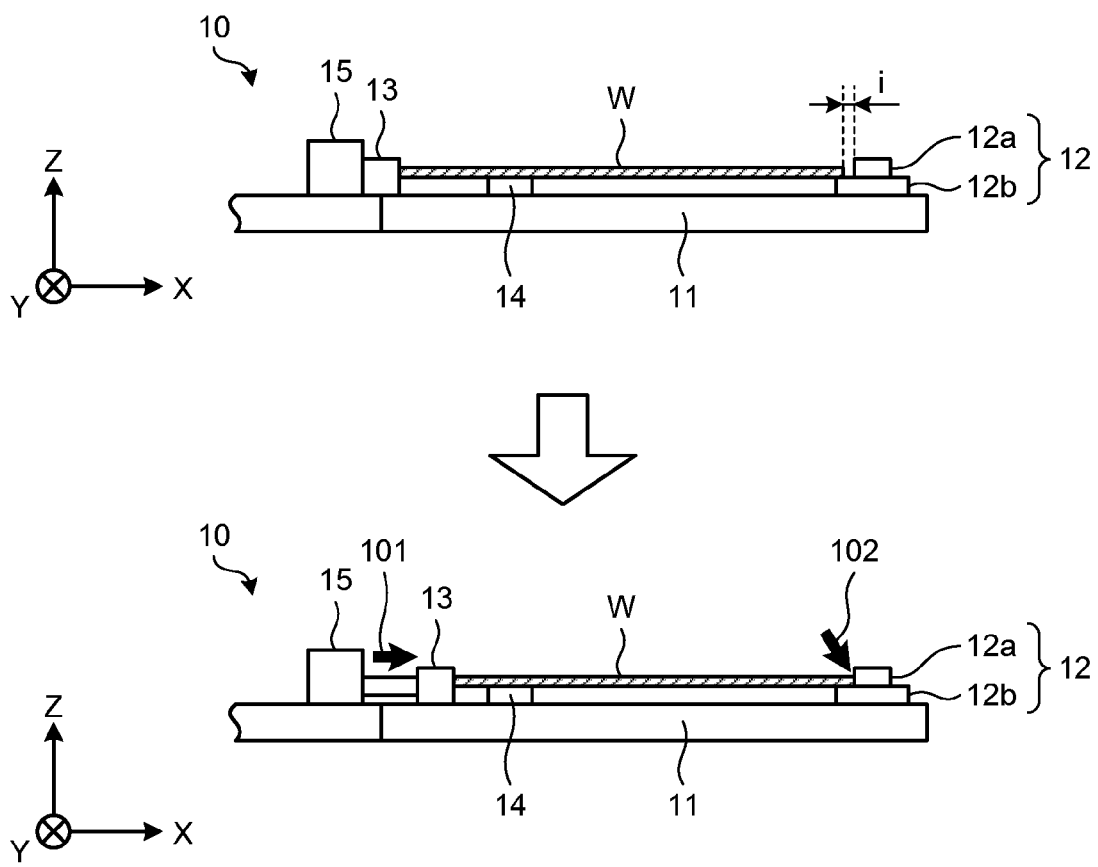
FIG. 3 is a diagram illustrating an operation of a movable claw.

Herein, an operation of the movable claw 13 is explained with reference to FIG. 3. FIG. 3 is a diagram illustrating an operation of the movable claw 13. The robot hand when being viewed from the negative direction of Y-axis is simply illustrated in FIG. 3. In this case, its upper portion of FIG. 3 indicates the situation where the board W is placed and is not gripped and its lower portion of FIG. 3 indicates the situation where the board W is gripped.

As illustrated in the upper portion of FIG. 3, before the board W is gripped, the board W is supported by the receiving seat 12b and the receiving seat 14 from only the lower side. At this time, a clearance "i" exists between the board W and a gripping claw, for example, the roller 12a of the fixed claw 12. Moreover, although a clearance may exist between the board W and the movable claw 13, the illustration of this case is omitted.

The receiving seat 12b and the receiving seat 14 have a predetermined height, and support the board W while setting a predetermined clearance based on the height between the lower surface of the board W and the upper surface of the plate 11. As a result, the adhesion of a particle to the board W can be prevented.

As illustrated in the lower portion of FIG. 3, when the board W is gripped, the robot 1 makes the driving unit 15 slide the movable claw 13 (see an arrow 101 in the diagram) toward the leading end of the plate 11 (in other words, toward the positive direction of X-axis in the diagram).

Then, the slid movable claw 13 presses the board W in a direction in which the board W comes into contact with the fixed claw 12 to fill up the clearance "i" and thus the peripheral border of the board W comes into contact with the roller 12a of the fixed claw 12 (see an arrow 102 in the diagram).

As a result, the peripheral border of the board W is sandwiched between the fixed claw 12 and the movable claw 13 and thus the board W is gripped.

Herein, a configuration example of a conventional fixed claw 12' will be explained with reference to FIG. 7. FIG. 7 is a diagram illustrating a configuration example of the conventional fixed claw 12'. As illustrated in FIG. 7, the conventional fixed claw 12' is integrally and fixedly formed of, for example, a side wall to which the board W is pressed and a receiving seat that supports the board W from the lower side.

For this reason, when the board W is repeatedly pressed to the side wall (see a double-headed arrow 106 in the diagram), a stress is repeatedly added to a specific region of the side wall and thus an abrasion "a" is easy to occur (see a part surrounded by a closed curve M1 in the diagram).

Because the positioning of the board W on the plate 11 has a deviance when the abrasion "a" occurs, it is necessary to exchange the fixed claw 12' each time. In other words, it takes a lot of trouble over maintenance.

Returning to FIG. 3, it is assumed that the peripheral border of the board W comes into contact with the roller 12a that can rotate along the peripheral border in the robot hand 10 according to the present embodiment. As a result, because it can be suppressed that a stress is repeatedly added to a specific region, the abrasion of the fixed claw 12 can be suppressed to reduce a maintenance trouble.

Moreover, in a state where the board W is supported from only the lower side as illustrated in the upper portion of FIG. 3, a deviance can occur along the XY plane in many times in addition to the clearance along the X-axis direction.

In connection with this point, the robot hand 10 according to the present embodiment passively rotates the roller 12a that abuts on the board W along the peripheral border of the board W to modify the deviance along the XY plane and guides the board W to a predetermined position. The details of this point are explained below with reference to FIGS. 5A and 5B.

Returning to FIG. 2, the predetermined position of the board W will be described. In FIG. 2, the board W is gripped by the pair of the fixed claws 12 and the movable claw 13 in such a manner that three points are supported.

Herein, it is assumed that the predetermined position of the board W is the position of the board W in this state. Hereinafter, it is assumed that the center of the board W at the predetermined position is a center P, an axis line parallel to X-axis passing through the center P is an axis C1, and an axis line parallel to Y-axis passing through the center P is an axis C2.

There may be provided an informing unit that counts the number of operations of the movable claw 13 and informs a user of the exchange time of the fixed claw 12 in accordance with the number of operations. For example, it is illustrated in FIG. 2 that the driving unit 15 includes an informing lamp 15a that lights in accordance with the number of operations of the movable claw 13. The user can use the lighting of the informing lamp 15a as a signal that indicates the exchange time of the fixed claw 12. The informing lamp 15a may be placed on a place other than the driving unit 15. An informing means is not limited to the lamp.

Figure 4A:
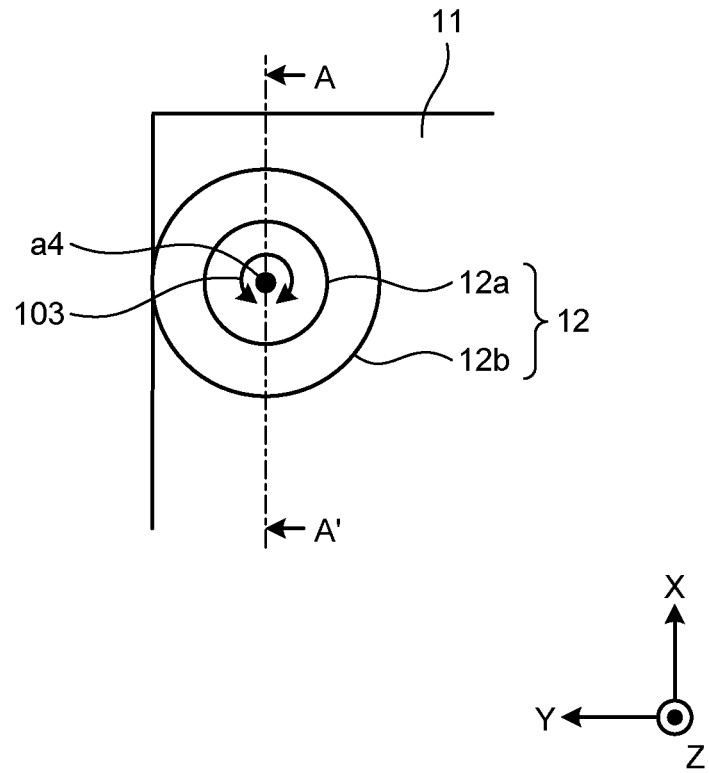
FIGS. 4A and 4B are diagrams illustrating a configuration example of a fixed claw.
Figure 4B:
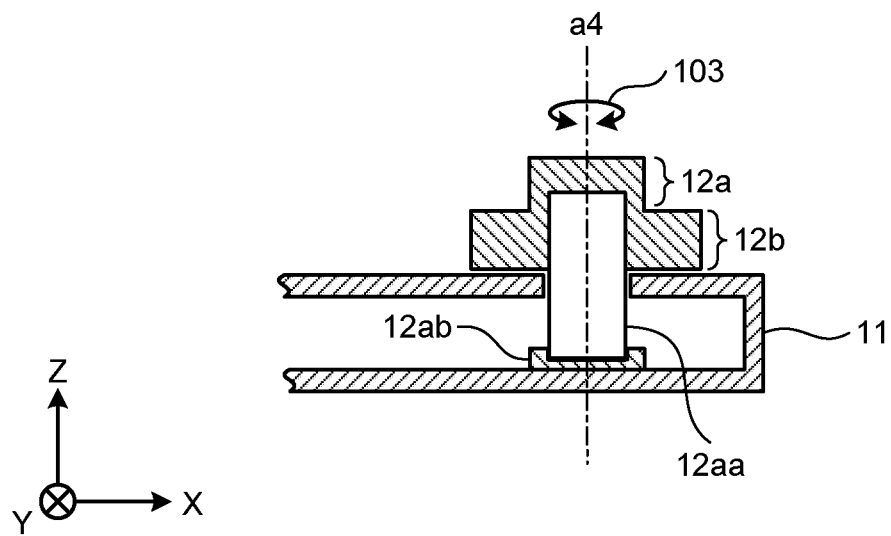

Next, a configuration example of the fixed claw 12 is explained with reference to FIGS. 4A and 4B. FIGS. 4A and 4B are diagrams illustrating a configuration example of the fixed claw 12. A plan view of the fixed claw 12 when being viewed from the positive direction of Z-axis is illustrated in FIG. 4A and a cross-sectional view of an A-A' cross section of FIG. 4A when being viewed from the negative direction of Y-axis is illustrated in FIG. 4B.

In FIGS. 4A and 4B, the left-side fixed claw 12 is illustrated among the pair of the fixed claws 12 illustrated in FIG. 2 that are divided by the axis C1. It is assumed that the right-side fixed claw 12 has the same configuration.

Although explanations are partly overlapped on the explanations of FIG. 2, the fixed claw 12 includes the roller 12a and the receiving seat 12b as illustrated in FIGS. 4A and 4B. Moreover, the roller 12a and the receiving seat 12b are integrally concatenated. The roller 12a abuts on the peripheral border of the board W to passively rotate along the peripheral border of the board W.

The receiving seat 12b is a member that is also referred to a pedestal that is integrated with the roller 12a to rotate along with the roller 12a. In other words, the roller 12a and the receiving seat 12b constitute a rotation body that can rotate along the peripheral border of the board W. Moreover, the receiving seat 12b has the maximum width that exceeds the diameter of the roller 12a. The receiving seat 12b places thereon the board W in a region of which the width exceeds the diameter of the roller 12a to support the board W from the lower side.

The roller 12a and the receiving seat 12b are provided to rotatably rotate around a rotation axis a4 on the plate 11 (see a double-headed arrow 103 in the diagram). In other words, the fixed claw 12 is a fixed and rotary gripping claw that is not displaced as described above and is rotatably supported on the plate 11. The fixed claw 12 may have an installation structure that a supporting pin 12aa that is provided through the plate 11 is borne by a bearing 12ab that is attached to the inside of the plate 11 and the roller 12a and the receiving seat 12b that are integrated, as illustrated in FIG. 4B, for example.

When the installation structure is employed, it is preferable to provide a predetermined clearance between "the roller 12a and the receiving seat 12b" and the plate 11 or between the plate 11 and the supporting pin 12aa in such a manner that the roller 12a and the receiving seat 12b can be smoothly rotated.

As illustrated in FIGS. 4A and 4B, the roller 12a and the receiving seat 12b can be respectively referred to as a "cylindrical part" that is formed in the shape of a cylinder and a "collar part" that projects in the shape of a collar from the cylindrical part, from the respective shapes. In other words, the outer circumferential surface of the "cylindrical part" contacts the end face of the peripheral border of the board W, and the upper surface of the "collar part" contacts the lower surface of the peripheral border of the board W.

Figure 5A:
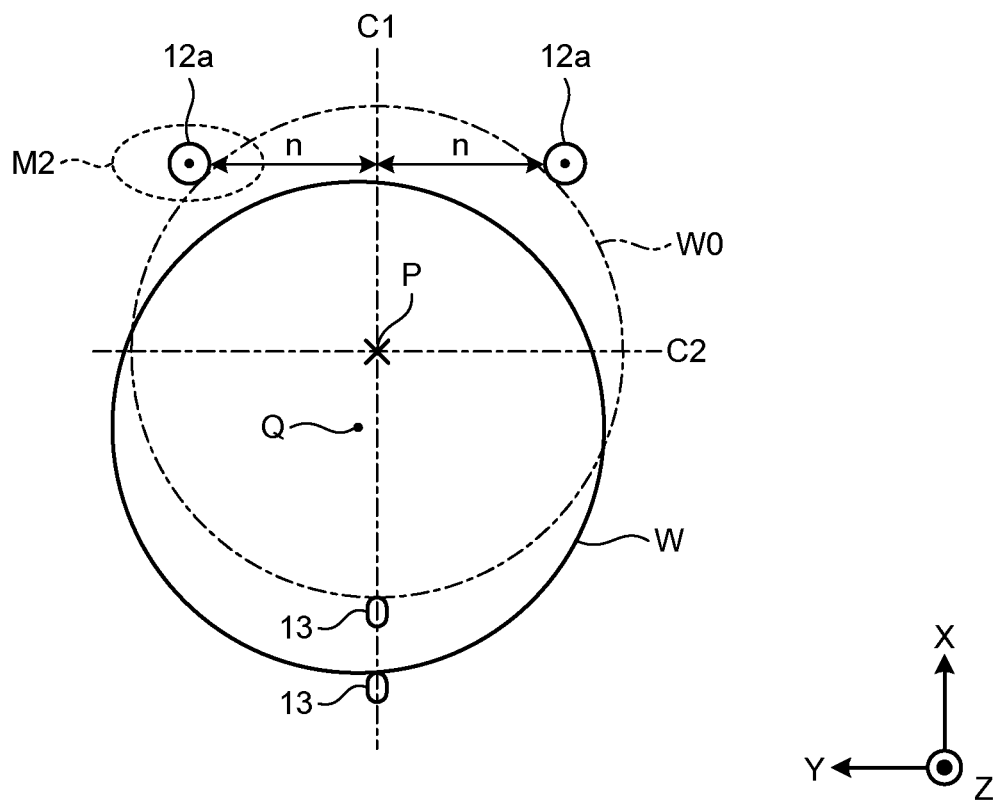
FIGS. 5A and 5B are diagrams illustrating an operation of a roller.
Figure 5B:
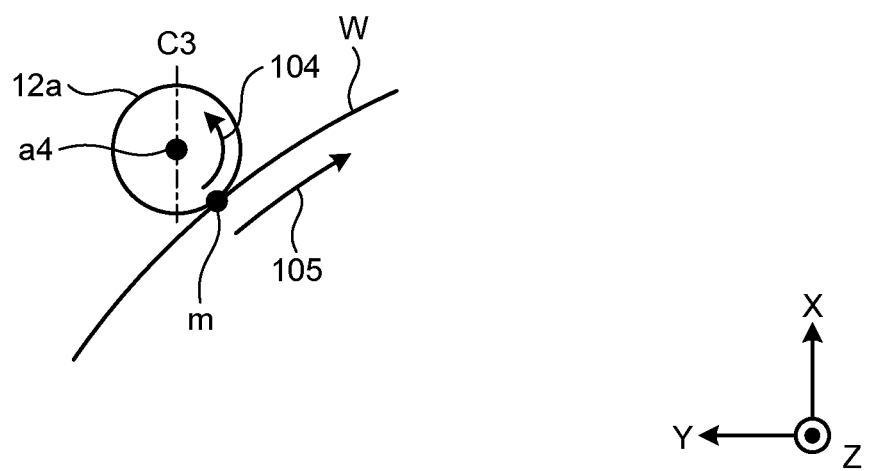

Next, an operation of the roller 12a when the board W abuts on is explained with reference to FIGS. 5A and 5B. FIGS. 5A and 5B are diagrams illustrating an operation of the roller 12a. In FIGS. 5A and 5B, only members required for explanations are simply illustrated and the receiving seat 12b that rotates along with the roller 12a is not illustrated. Moreover, an M2 region illustrated in FIG. 5A is enlarged and illustrated in FIG. 5B.

First, it is assumed that a pair of the rollers 12a is arranged at symmetrical positions of the axis C1, in which an interval between each the rollers 12a and the axis C1 is "n", as illustrated in FIG. 5A. In this way, it is preferable that the pair of the rollers 12a is arranged at symmetrical positions to the orbit along which the movable claw 13 presses the board W.

Herein, as illustrated by the solid-line board W of FIG. 5A, the board W before being gripped is placed in many cases with being deviated along the XY plane from a virtual board W0 located at a predetermined position. For example, as illustrated in FIG. 5A, it is assumed that a center Q of the board W is deviated from the predetermined central position P to the left side of the axis C1 and to the lower side of the axis C2.

In this state, it is assumed that the movable claw 13 presses the board W along the X-axis direction. In this case, the board W simultaneously does not abut on the pair of the rollers 12a but abuts on the left-side roller 12a surrounded by the closed curve M2.

Herein, it is assumed that the board W abuts on the roller 12a at a contact point "m" as illustrated in FIG. 5B. In this case, the board W, which abuts on the contact point "m" located at the right side of an axis C3 that passes through the center of rotation of the roller 12a and is parallel to the pressing direction of the movable claw 13, passively rotates the roller 12a counterclockwise by using the pressing force and the frictional force of the abutment surface (see an arrow 104). Although it is not illustrated, the rotation is performed by further adding a frictional force between the receiving seat 12b (see FIGS. 4A and 4B) and the lower surface of the peripheral border of the board W with which the upper surface of the receiving seat 12b contacts.

The board W changes its direction from the pressing direction to the direction of an arrow 105 and moves while rotating itself, in accordance with the rotation of the roller 12a. Then, the board W stops its movement by abutting on the right-side roller 12a located at the opposite symmetrical position of the axis C1 and is placed at the predetermined position indicated by the board W0. In other words, the board W is guided to the predetermined position while modifying the deviance caused along the XY plane and is gripped by the pair of the fixed claws 12 and the movable claw 13.

Then, because the roller 12a abuts on the board W while rotating while the board W is being guided, only the specific region of the outer circumferential surface of the roller 12a does not receive a stress caused by the abutment. In other words, because the abrasion of the roller 12a can be suppressed, a maintenance trouble on an exchange operation or the like can be reduced.

Although it is not illustrated, the receiving seat 12b (see FIGS. 4A and 4B) rotates along with the roller 12a while supporting the board W from the lower side and thus the board W is smoothly moved without scratching the lower surface.

As described above, because the roller 12a and the receiving seat 12b (see FIGS. 4A and 4B) cause a frictional force from the abutment surface between them and the board W when they are passively rotated, it is preferable that materials that constitute the outer circumferential surfaces of the roller 12a and the receiving seat 12b are one that can generate a predetermined frictional force when the outer circumferential surfaces contact with the peripheral border of the board W.

It has been explained that the roller 12a located at the left side of the axis C1 is illustrated in FIGS. 5A and 5B. However, it is obvious that the roller 12a located at the right side performs a similar operation although there is a difference between left and right.

Till now, it has been explained that the roller 12a that passively rotates by abutting on the board W is included in the fixed claw 12. However, the roller 12a may be provided in a gripping member that is located at a side at which the board W is pressed.

Figure 6A:
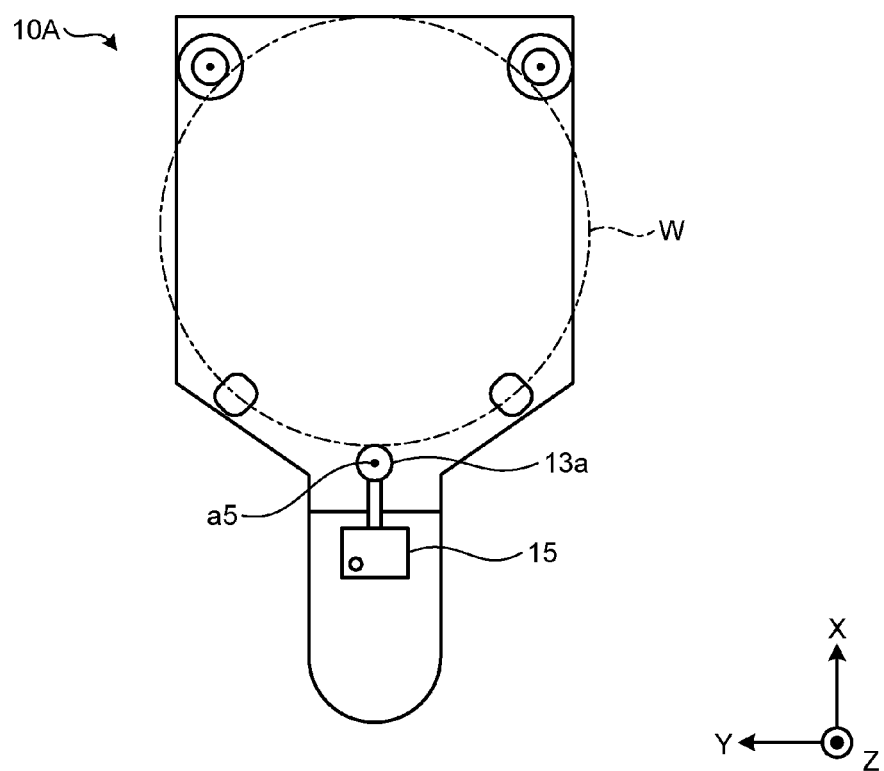
FIGS. 6A and 6B are diagrams illustrating a configuration example of a robot hand according to an alternative example.
Figure 6B:
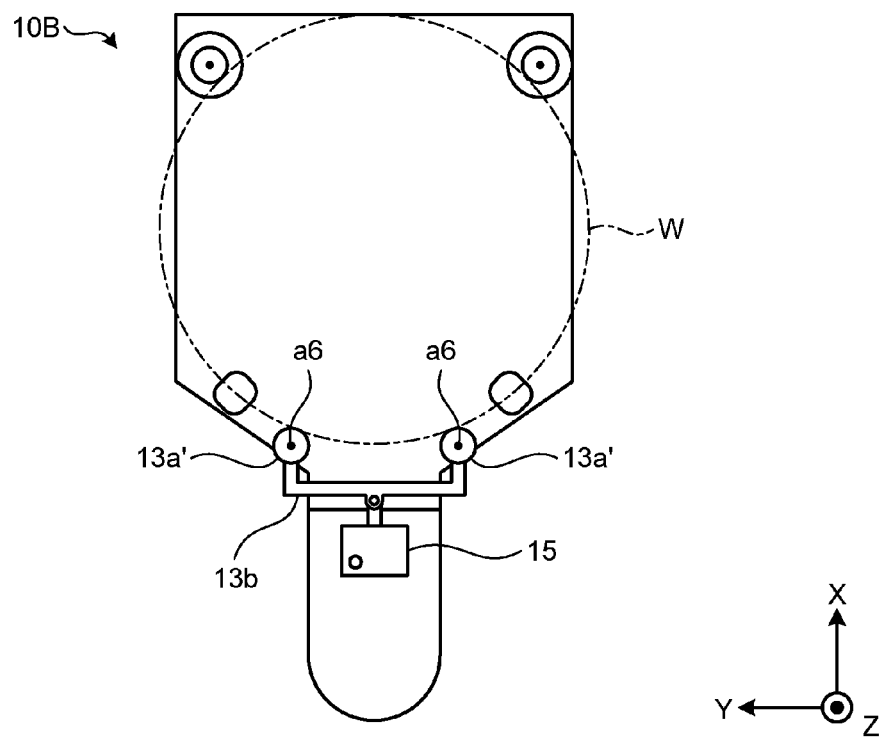

Therefore, an alternative example is explained with reference to FIGS. 6A and 6B. FIG. 6A is a diagram illustrating a configuration example of a robot hand 10A according to an alternative example. FIG. 6B is a diagram illustrating a configuration example of a robot hand 10B according to another alternative example.

The same components of FIGS. 6A and 6B as those of the robot hand 10 according to the embodiment have reference numbers only when explanation on the components are required.

As illustrated in FIG. 6A, the robot hand 10A according to the alternative example includes a roller 13a as a gripping member that is slid by the driving unit 15 to press the board W. The roller 13a is rotatably provided around a rotation axis a5.

When the board W is placed with being deviated along the XY plane, the roller 13a also rotates when the roller 13a abuts on the board W due to the same reason as that of FIGS. 5A and 5B. In other words, because only the specific region of the outer circumferential surface is hard to be subjected to a stress, an abrasion can be suppressed to reduce a maintenance trouble.

Like rollers 13a' that rotatably move around a rotation axis a6 of the robot hand 10B illustrated in FIG. 6B, a plurality of gripping members at a pressing side may be provided and connected by a connecting member 13b to slide parallel to each other. In this case, the abrasion of the rollers 13a' can be not only prevented, but also the robot hand can surely respond to a deviance even when the deviance of the board W is large.

As described above, the robot hand according to the embodiment includes a plate that is a base and a plurality of gripping claws that is arranged on the plate and contacts the peripheral border of a board to grip the board. At least one of the gripping claws rotates while abutting on the peripheral border of the board.

Therefore, according to the robot hand according to the embodiment, the abrasion of a member can be suppressed to reduce a maintenance trouble.

Meanwhile, it has been explained in the embodiment that, when the robot hand includes a pair of fixed claws, both of the fixed claws include respective rollers. However, the present embodiment is not limited to this. For example, only one of the fixed claws may include a roller.

In this case, when a deviance of a board placed on a plate is always biased toward a constant direction or when only the part of a peripheral border of the board has an R shape, only the fixed claw that abuts on the range includes a roller and thus at least the abrasion of the range can be suppressed. Therefore, the shape of the board may not be limited to a circle.

A point that only the specific fixed claw includes a roller in this way may be similarly applied to a movable claw.

It has been mainly explained in the embodiment that the rotation body is a roller. However, the present embodiment is not limited to this. For example, the embodiment may employ a gripping member in which a region abutting on a board is a spherical rotation body.

Moreover, it has been explained in the embodiment that a gripping member is placed near the leading end or the tail end of a plate. The arrangement position of the gripping member is not limited to this.

Moreover, it has been mainly explained in the embodiment that a board is a semiconductor wafer as an example. It is obvious that a board can be applied without distinction of its type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A robot hand that supports and grips a board comprising:
    a base;
    two rotary supporting units arranged on the base to be rotatable with respect to the base about a rotational axis, each of the rotary supporting units comprising:
        a cylindrical roller rotatable with respect to the base about the rotational axis; and
        a first receiving seat projecting outward from a lower part of the cylindrical roller and including an upper plane;
    a second receiving seat arranged on the base at a position opposite to the first receiving seats, an upper plane of the second receiving seat being on a same plane as the upper plane of the first receiving seats to support the board together with the first receiving seats from a lower side of the board;
    a movable supporting unit arranged on the base at a position opposite to the rotary supporting units to press the board toward the rotary supporting units to grip the board together with the cylindrical rollers; and
    wherein the base further includes: two supporting pins that are provided through the base to correspond to the respective rotary supporting units; and two bearings that are attached to an inside of the base to correspond to the respective supporting pins, and wherein each of the supporting pins is borne by the corresponding bearing, cylindrical roller, and the first receiving seat.

2. The robot hand according to claim 1, wherein
    the rotary supporting units are placed near a leading end of the base, and
    the movable supporting unit is placed near a tail end of the base.

3. The robot hand according to claim 1, further comprising:
    an informing unit configured to count a number of operations of the movable supporting unit to inform a user of an exchange time of the rotary supporting units in accordance with the number of operations.

4. A robot comprising a robot hand according to claim 1.

5. The robot according to claim 4, wherein the upper plane of the second receiving seat has a same height as that of the upper planes of the first receiving seats with respect to the base.

6. The robot according to claim 5, wherein
    the first receiving seat has a cylindrical shape, and
    the first cylindrical receiving seat has a size larger than that of the cylindrical roller.

7. The robot according to claim 4, wherein
    the first receiving seat has a cylindrical shape, and
    the first cylindrical receiving seat has a size larger than that of the cylindrical roller.

8. The robot according to claim 4, wherein the movable supporting unit is arranged on the base at a position opposite to a central position between the rotary supporting units.

9. The robot according to claim 4, wherein
    the rotary supporting units are placed near a leading end of the base, and
    the movable supporting unit is placed near a tail end of the base.

10. The robot according to claim 4, wherein the rotary supporting units are rotated with respect to the base about the rotational axis by a pressing force of the movable supporting unit and a friction force between the upper planes of the first receiving seats and the lower side of the board when movable supporting unit presses, toward the rotary supporting units, the board which is in contact with the upper planes of the first receiving seats.

11. The robot according to claim 4, wherein the cylindrical roller and the first receiving seat are integrally concatenated.

12. The robot hand according to claim 1, wherein each of the upper planes of the first receiving seats is perpendicular to the rotational axis.

13. The robot hand according to claim 1, wherein the rotary supporting units are rotated with respect to the base about the rotational axis by a pressing force of the movable supporting unit and a friction force between the upper planes of the first receiving seats and the lower side of the board when the movable supporting unit presses, toward the rotary supporting units, the board which is in contact with the upper planes of the first receiving seats.

14. The robot hand according to claim 1, wherein the upper plane of the second receiving seat has a same height as that of the upper planes of the first receiving seats with respect to the base.

15. The robot hand according to claim 14, wherein
the first receiving seat has a cylindrical shape, and
the first cylindrical receiving seat has a size larger than that of the cylindrical roller.

16. The robot hand according to claim 1, wherein
the first receiving seat has a cylindrical shape, and
the first cylindrical receiving seat has a size larger than that of the cylindrical roller.

17. The robot hand according to claim 1, wherein the movable supporting unit is arranged on the base at a position opposite to a central position between the rotary supporting units.

18. The robot hand according to claim 1, wherein the cylindrical roller and the first receiving seat are integrally concatenated.

19. The robot hand according to claim 18,
wherein the base further includes:
two supporting pins that are provided through the base to correspond to the respective rotary supporting units; and
two bearings that are attached to an inside of the base to correspond to the respective supporting pins, and
wherein each of the supporting pins is borne by the corresponding bearing, cylindrical roller, and the first receiving seat.

* * * * *